United States Patent [19]
Lamphier et al.

[11] Patent Number: 5,659,508
[45] Date of Patent: Aug. 19, 1997

[54] SPECIAL MODE ENABLE TRANSPARENT TO NORMAL MODE OPERATION

[75] Inventors: Steven Harley Lamphier, St. Albans; Kevin George Petrunich, Essex Junction; Harold Pilo, Underhill; Ronald DeSales Rossi, Swanton; Roger Andrew Verhelst, Colchester, all of Vt.; Paul Stafford Zerr, Gilbert, Ariz.

[73] Assignee: International Business Machine Corporation

[21] Appl. No.: 568,411

[22] Filed: Dec. 6, 1995

[51] Int. Cl.$^6$ .................. G11C 7/00; G11C 8/00
[52] U.S. Cl. .............. 365/201; 365/189.08; 365/226; 365/230.06
[58] Field of Search ................. 365/201, 189.05, 365/189.08, 226, 230.06

[56] References Cited

U.S. PATENT DOCUMENTS

| | | | |
|---|---|---|---|
| 4,268,911 | 5/1981 | Bell | 365/104 |
| 4,661,930 | 4/1987 | Tran | 365/201 |
| 4,868,823 | 9/1989 | White, Jr. et al. | 365/201 |
| 5,056,061 | 10/1991 | Akylas et al. | 365/96 |
| 5,134,586 | 7/1992 | Steele | 365/201 |
| 5,285,419 | 2/1994 | Iyengar | 365/201 |
| 5,301,143 | 4/1994 | Ohri et al. | 365/96 |
| 5,345,413 | 9/1994 | Fisher et al. | 365/201 |
| 5,408,435 | 4/1995 | McClure et al. | 365/201 |

*Primary Examiner*—David C. Nelms
*Assistant Examiner*—Trong Quang Phan
*Attorney, Agent, or Firm*—Heslin & Rothenberg, P.C.

[57] ABSTRACT

Circuit and method are presented for activating/deactivating a special operational mode at power-on of an integrated circuit device having no industry defined test state and/or dedicated test pin. The operational mode is enabled upon powering on the integrated circuit combined with detection of a predefined pattern of a first logic state and a second logic state clocked in successive cycles within a first standard input signal, such as an output enable signal, for a normal operating mode of the device. Special non-functional processing is then performed, such as reading prestored identification data from the integrated circuit and/or testing the integrated circuit via embedded test circuitry including boundary scan or other diagnostic circuitry. This special operational mode is deactivated upon receipt at the integrated circuit device of a second standard input signal, such as a write signal for a random access memory (RAM) device, of a predefined logic state (e.g., write enable state). Deactivating of the special operating mode is transparent to the normal response of the integrated circuit device to the second standard input signal.

19 Claims, 5 Drawing Sheets fig. 1 fig. 2 fig. 3 fig. 4 fig. 5 fig. 6

SPECIAL MODE ENABLE TRANSPARENT TO NORMAL MODE OPERATION

TECHNICAL FIELD

This invention relates in general to integrated circuit testing and identification, and more particularly, to a circuit and method for activating/deactivating a special non-functional mode at power-on of an integrated circuit having no industry standard defined test state and/or dedicated test pin. The concepts presented are particularly applicable to random access memory (RAM) devices, including static random access memory (SRAM) devices.

BACKGROUND ART

In modern high density memories, such as random access memories having one Megabit or more, the time and equipment required to test functionality and timing of all bits in the memory constitute a significant portion of the RAM die fabrication cost. Accordingly, as the time required for such testing increases, the manufacturing costs also increase. Similarly, if the time required for the testing of memory can be reduced, then the manufacturing cost of the memory is reduced. Since the manufacturing of memory devices is generally done in high volume, the savings of even a few seconds per device can result in significant costs reduction.

Random access memories (RAMs) are especially subject to having significant test costs, not only because of the necessity of both writing data to and reading data from each bit in memory, but also because RAMs are often subject to pattern sensitivity failures. Pattern sensitivity failures arise because the ability of a bit to retain a stored data state may depend upon the data states stored in, and the operations upon, bits which are physically adjacent to that bit being tested. This causes the test time for RAMs to be not only linearly dependent upon die density (i.e., the number of bits available for storage) but, for some pattern sensitivity tests, also dependent upon the square (or 3/2 power) of the number of bits in the memory. Obviously, therefore, as the density of RAM devices increases (generally by a factor of four, from generation to generation), the time required to test each device in production rapidly increases.

It should be noted that many other integrated circuit devices, besides memory chips, themselves utilize memories on-chip. Examples of such integrated circuits include many modern microprocessors and microcomputers, as well as custom devices such as gate arrays which have memory embedded therein. Similar cost pressures are faced in the production of these products as well, including the time and equipment required for testing of the memory portions.

One solution which has been used to reduce the time and equipment required for the testing of semiconductor memories such as RAMs is to employ special "test" modes, where the memory enters a special operational state different from its normal operational mode. In such test modes, the operation of the memory can be quite different from that of normal operation, since the operation of internal testing can be done without being subject to the constraints of normal operation.

An example of a special test mode is an internal "parallel," or multibit, test mode. Conventional parallel test modes allow access to more than one memory location in a single cycle, with common data written to and read from the multiple locations simultaneously. For memories which have multiple input/output terminals, multiple bits would be accessed in such a mode for each of the input/output terminals in order to achieve the parallel test operation. This parallel test mode of course is not available in normal operation, since the user must be able to independently access each bit in order to utilize the full capacity of the memory. Such parallel testing is preferably done in such a way so that the multiple bits accessed in each cycle are physically separated from one another to ensure that there is little likelihood of pattern sensitivity interaction among the simultaneously accessed bits. A description of such parallel testing may be found in McAdams et at., "A 1-Mbit CMOS Dynamic RAM With Design-For-Test Functions," IEEE Journal of Solid-State Circuits, Vol SC-21, No. 5, pp. 635–642 (October 1986).

Other special test modes may be available for particular memories. Examples of tests which may be performed in such modes include the testing of memory cell data retention times, tests of particular circuits within the memory such as decoders or sense amplifiers, and the interrogation of certain portions of the circuit to determine attributes of the device such as whether or not the memory has had redundant rows or columns enabled. The above-referenced article by McAdams et al. describes these and other examples of special test functions.

Of course, when the memory device is in such a special test mode, it is not operating as a fully randomly accessible memory. As such, if the memory is in a test mode by mistake, for example when installed in a system, data cannot be stored and retrieved as would be expected. By way of example, when in parallel test mode, the memory should write the same data state to a plurality of memory locations. Accordingly, when presented with an address in parallel test mode, the memory will output a data state which does not depend solely on the stored data state, but may also depend upon the results of the parallel comparison. Furthermore, the parallel test mode necessarily reduces the number of independent memory locations to which data can be written and retrieved, since four, or more, memory locations are simultaneously accessed. It is therefore important that the enabling of the special test modes be accomplished in such a manner that the chance is low that a special test mode will be inadvertently entered.

Prior techniques for entry into special test modes include the use of a special terminal for indicating the desired operation. More particularly, a simple prior technique for the entry into test mode is the presentation of a logic level, high or low, at a dedicated terminal to either select the normal operation mode or a special operation mode such as parallel test, as described in U.S. Pat. No. 4,654,849. Another approach for the entry into test mode using such a dedicated terminal is disclosed in Shimada et al., "A 46-ns 1-Mbit CMOS SRAM," IEEE Journal of Solid-State Circuits, Vol. 23, No. 1, pp. 53–58 (February 1988), where a test mode is enabled by the application of a high voltage to a dedicated control pad while performing a write operation. These techniques are relatively simple but they of course require an additional terminal besides those necessary for normal memory operation.

While such an additional terminal may be available when the memory is tested in wafer form, significant test time also occurs after packaging, during which special embedded test modes are useful. In order to use this technique of a dedicated test enable terminal for package test, it is therefore necessary that the package have a pin or other external terminal for the function. However, due to the desires of the system designer that a circuit package be as small as possible, with as few connections as possible, the use of a dedicated pin for self-test mode entry is undesirable. Furthermore, if a dedicated terminal for entering the test mode is provided in packaged form, the user of the memory must take care to ensure that the proper voltage is presented to this dedicated terminal so that the test mode is not unintentionally entered during normal system usage. Accordingly, providing an additional terminal for a chip enable function only during special test modes is not considered desirable. Such a terminal is especially undesirable considering that an additional signal or bias line must be provided to the terminal when the device is installed in a memory system.

Another technique for enabling a special test mode is the application of an illegal condition such as an overvoltage signal at one or more terminals which have other functions during normal operation, such overvoltage indicating that a test mode is to be enabled. This concept is described in U.S. Pat. No. 4,654,849, and in U.S. Pat. No. 4,860,259 (using an overvoltage on an address terminal). Said U.S. Pat. No. 4,860,259 also describes a method which enables a special test mode in a dynamic RAM responsive to an overvoltage condition at the column address strobe terminal followed by the voltage on this terminal falling to a low logic level. The McAdams et al. article, cited hereinabove, describes a method of entering test mode which includes the multiplexing of a test number onto address inputs while an overvoltage condition exists on a clock pin, where the number at the address inputs selects one of several special test modes. Due to its additional complexity, overvoltage enabling of special test modes does add additional security that special test modes will not be entered inadvertently, i.e., relative to the use of a dedicated control terminal for enabling the test modes. However, the approach disadvantageously requires added circuit complexity and costs, while still not guaranteeing against inadvertent activation of a test mode, e.g., resulting from a signal spike.

Thus, a genuine need exists in the art for a novel approach to initiating a special non-functional mode which requires no predefined "illegal condition" to enter or dedicated test pin, and is totally transparent to an end user, as well as employing a disable scheme for the special non-functional mode which guarantees no interference with an end user's functional mode.

SUMMARY OF THE INVENTION

Briefly summarized, this invention comprises in a first aspect an integrated circuit having a normal operating mode and a special operating mode implemented by normal operating mode circuitry and special operating mode circuitry, respectively. Activation circuitry is electrically coupled to the special operating mode circuitry and includes a first circuit means, a second circuit means, and a third circuit means. The first circuit means is responsive to powering on of the integrated circuit, while the second circuit means is responsive to clocking of a conventional input signal to the normal operating mode circuitry in a predefined pattern of a standard first logic state and a standard second logic state. The third circuit means is electrically coupled to both the first circuit means and the second circuit means and is responsive to a response of the first circuit means combined with a response of the second circuit means for activating the special operating mode circuitry, thereby initiating the special operating mode.

In another aspect, a deactivation circuit is provided for deactivating a special operating mode circuit of an integrated circuit transparent to functioning of normal operating mode circuitry of the integrated circuit. The deactivation circuit comprises a logic circuit responsive to clocking of an industry standard input signal to the normal operating mode circuitry. The industry standard input signal comprises a signal required to precede outputting of valid data from the normal operating mode circuitry. The logic circuit comprises means for deactivating the special operating mode circuitry in response to a predefined state of the industry standard input signal. This deactivating of the special operating mode circuitry is transparent to and simultaneous with functioning of the normal operating mode circuitry in response to the industry standard input signal. In a preferred embodiment, the integrated circuit comprises a random access memory device, the industry standard input signal comprises a write signal to the random access memory device, and the predefined state comprises a write enable state.

In a still further aspect, a method for activating/deactivating a special operating mode of an integrated circuit is provided. The method includes: powering on the integrated circuit; subsequent thereto, monitoring a first, normal operating mode input signal for a predetermined pattern of a first logic state and a second logic state clocked in successive clock cycles; and responding to monitoring of the predetermined pattern by activating the special operating mode. This simplified activation approach is possible due to a deactivating technique which comprises deactivating the special operating mode in response to receipt of a second, normal operating mode input signal having a predefined logic state. The second, normal operating mode input signal comprises a signal required to precede outputting of valid data from said integrated circuit during a normal operating mode. The deactivating of the special operating mode is transparent to and simultaneous with functioning of the normal operating mode in response to the second, normal operating mode input signal.

In still another embodiment, a method for controlling operation of an integrated circuit having a normal operating mode and a special operating mode is provided. The method includes: initiating the special operating mode upon sensing powering on of the integrated circuit combined with detection of a predefined pattern of a first logic state and a second logic state clocked in successive clock cycles in a first industry standard input signal to the integrated circuit, said first industry standard input signal being required for the normal operating mode; upon entering the special operating mode, performing a special non-functional process comprising at least one of reading prestored identification data from the integrated circuit and testing the integrated circuit via test circuitry embedded within the integrated circuit; and deactivating the special operating mode upon receipt by the integrated circuit of a second industry standard input signal for the normal operating mode, the second industry standard input signal being of a predefined standard logic state. Further, the deactivating of the special operating mode is transparent to functioning of the normal operating mode in response to the second industry standard input signal. The second industry standard input signal comprises a signal required to precede outputting of valid data from the integrated circuit during the normal operating mode.

In another aspect, the invention comprises a method for deactivating a special operating mode of a random access memory (RAM) device having a normal operating mode. The method comprises receiving a write signal at the RAM device and if the write signal comprises a write enable state, then responding thereto by deactivating the special operating mode. The deactivating of the special operating mode is transparent to and simultaneous with writing the RAM device in response to the write enable state of the write signal.

To restate, a novel approach to initiating and disabling a special nonfunctional mode at power-on is provided herein which is totally transparent to operation of the functional mode circuitry. In one implementation, the approach allows a manufacturer the ability to electronically read identification data encoded onto a die without the possibility of this special identification mode interfering with subsequent normal product operation. Identification data can include production run number, lot number, die location on wafer, manufacturing codes, etc. Thus, real time feedback can be provided on reliability and die defects. Die tracking, sorting verification, etc., are obvious benefits to such electronic die marking and reading.

Additionally, embedded test circuitry may be provided for an integrated circuit die having no standardly defined test mode (e.g., defined by JTAG convention) or dedicated test pin. Any desired diagnostic or test circuitry can be embedded, with the initiating/disabling approach presented herein making the test circuitry totally transparent to the resultant functioning of the integrated circuit. Thus, opportunity is provided for an embedded test mode on integrated circuits that were previously closed to such self testing techniques, e.g., static random access memory SRAM devices. Any number of test or verification modes could be enabled/disabled at power-on employing a strategy in accordance with the present invention. The concepts are particularly significant when employed in random access memory (RAM) devices, wherein in accordance with the invention a first write cycle subsequent to power on is employed as the cancellation signal for any special non-functional mode, i.e., until power is recycled. Thus, special operational mode is never available during normal chip operation and cannot be accidentally enabled subsequent to a first write cycle. For other devices, a different function than a write cycle could be employed to disable a special non-functional mode entered subsequent to power-on. Specifically, any function that must be carried out prior to ascertaining of valid output data from the device is a candidate for this technique. A write cycle is convenient for a RAM device as the termination point since no valid data can obviously be read out until a write is carried out subsequent to power on of the device. As a further advantage, implementation of the concepts presented herein adds no delay to the critical path for devices that already incorporate with a gated final latch.

BRIEF DESCRIPTION OF THE DRAWINGS

The subject matter which is regarded as the present invention is particularly pointed out and distinctly claimed in the concluding portion of the specification. The invention, however, both as to organization and methods of practice, together with further objects and advantages thereof, may best be understood by reference to the following detailed description taken in conjunction with the accompanying drawings in which:

DETAILED DESCRIPTION OF THE PREFERRED EMBODIMENTS

Although principally described herein with reference to a random access memory (RAM) device, and in particular, to the reading of identification data from such a device during a special non-functional mode, the invention and the appended claims should be understood to encompass a broader scope. The concepts presented are applicable to any integrated circuit die for which a special, non-functional mode at power-on is desired, particularly to a die wherein there is no dedicated test pin available or test mode predefined by industry standard.

As used herein, the phrase "special operating mode" refers to any mode other than a standard functional mode for which the integrated circuit die was designed, including but not limited to a self-identification mode and a self-test mode, while the phrase "normal operating mode" refers to a conventional operation mode wherein the die functions as designed in response to received industry standard input signals, such as a write or read mode of a RAM device. Further, the phrase "normal operating mode input signal" refers to an industry standard input signal such as an address, data or control signal required during normal operating mode, and which is of a conventional logic level, i.e., a logic high or logic low level. The phrase does not include an illegal condition signal such as an overvoltage signal. Specific examples of such a signal include an output enable signal, a read/write control signal, and column enable and row enable signals, etc.

A significant aspect of the invention is that a normal operating mode input signal is identified as necessary to precede/begin a normal operating mode subsequent to power-on of a given integrated circuit die. For example, in a RAM device data must be first written into the device after power-on before output from a normal operating mode is possible. Thus, a write signal precedes/initiates a normal operating mode. The invention employs this concept to terminate the special operating mode upon receipt by the integrated circuit device of such a normal operating mode input signal in a predefined state (e.g., a write enable state). This is preferably accomplished without interfering with the functional response of the normal operating mode to the received input signal, that is, deactivating of the special operating mode is "transparent" to (does not interfere with) the normal operating mode. Due to this novel deactivation approach, a simple activation technique can be employed.

The phrase "identification mode" and the term "IDMODE" are used herein to comprise one example of a special operating mode to be activated/deactivated at power-on in accordance with the present invention. An identification mode seeks to allow a manufacturer the ability to electronically read data permanently stored on a die or integrated circuit device without the possibility of interfering with subsequent normal product operation. In accordance with one implementation of the invention, stored data, such as production run number, lot number, die location on wafer, manufacturing codes, etc., is available to be read through normally accessed pins, and is totally transparent to the end user. No industry defined device mode or "illegal condition" is required to hide the identification mode.

As one implementation overview, a threshold voltage $V_T$ reference in a "power on clear" circuit of a conventional RAM device can be employed to generate a low-to-high transition at device power-on to reset a latch that enables an "identification mode." When the device is in this mode, normal reads are blocked and an output pin is enabled through which data permanently stored in the die, for example, in a laser patterned fuse array, is serially read out. Data can be parallel loaded from the fuse array into a shift register at the time the "identification mode" is enabled. As described further below, all clocks required to shift data off the device are generated from a standard device clock pin, and the critical paths for data in and out of the device are not disturbed.

The identification mode can be permanently disabled for a given power-on cycle by initiating a normal chip write operation. In accordance with the invention, the identification mode is immediately discontinued upon initiation of a write cycle, and simultaneously, the write cycle is executed normally. Hence forth, the memory device operates as designed to normally function. This disable scheme guarantees no interference with the end user, since prior to writing the device no valid data is available to be read. Once deactivated, test/identification mode may only be reinstated by cycling power to the integrated circuit device. However, multiple scans of stored identification data in a given power-on cycle are possible provided no write to the integrated circuit device is executed. The device is clocked normally at all times.

In certain rare cases, the threshold voltage $V_T$ reference "power-on clear" circuit will not produce an intended CLR signal. This signal is generally used to set device latches so that the device powers on to a known and deselected state. If the signal fails under these conditions, the worst that can happen is that the device fails to power up with the outputs enabled. By choosing the CLR signal to set an internal latch to enable the identification mode, it is guaranteed that the mode will be selected by powering up the device in a known stable manner. If the CLR signal fails, then the identification mode is simply not selected as intended herein.

After initial device power-on, and as one example, the special operating mode can be entered by forcing the device output enable ($\overline{OE}$) pin low (enabled) for at least a cycle. This is followed by holding the $\overline{OE}$ pin high (tri-state) for X cycles, wherein $X \geq 1$. Some time before the start of the X+1 cycle, $\overline{OE}$ must again be brought low. Thereafter, the device is in the identification mode, and the fuse array data (for example) can be automatically parallel loaded into a shift register. On the X+1 cycle and every odd cycle following it, a new fuse bit is presented on a selected data out (DQ) pin. The $\overline{OE}$ pin must continue to be held low and no writes initiated to remain in the identification mode. To reload the shift register and begin the identification mode again, the $\overline{OE}$ pin needs to be brought high for a cycle and the above sequence repeated. Note that any number of clock cycles, or combination of normal operating mode input signals, can be employed to enable a special operating mode, such as an identification mode. A key point of this invention is that the special mode is disabled simultaneous to a first write to the device. This disabling is maintained for the remaining time that power is applied to the device.

Numerous variations on the above-outlined scheme could be employed. For example, a parallel read out approach might be used rather than serial read out of data through a single data out (DQ) port. Any number of test or verification modes can be enabled/disabled with the strategy presented, for example, using different predefined patterns on the same or a different normal operating mode input signal(s). As a further variation, any non-volatile storage could be used to hold die identification data rather than, e.g., a laser blown fuse array. Note that with electronic identification, electronic tracking of parts both during production and in subsequent field use is possible. Also, electronic verification of proper die sorting and marking can be conducted, and instant feedback of die history for reliability and defect learning are possible.

Further, another function rather than a write operation could be used to disable the identification mode or test mode for another type of device. It is convenient for a RAM device to use the write cycle as a termination point since no valid data is available at its output until a write is carried out. If a part has an output pin and some standard function that must be carried out prior to valid output operation, then the part is a candidate for the concepts presented herein. As a further consideration, implementation of this invention will not add to the critical path delay in those devices which already incorporate with a gated final (off-chip driver) latch. Other implementations such as multiplexing a driver on an input pin, or adding a gate in an existing output path are possible, but may incur a small delay or loading penalty.

Figure 1:
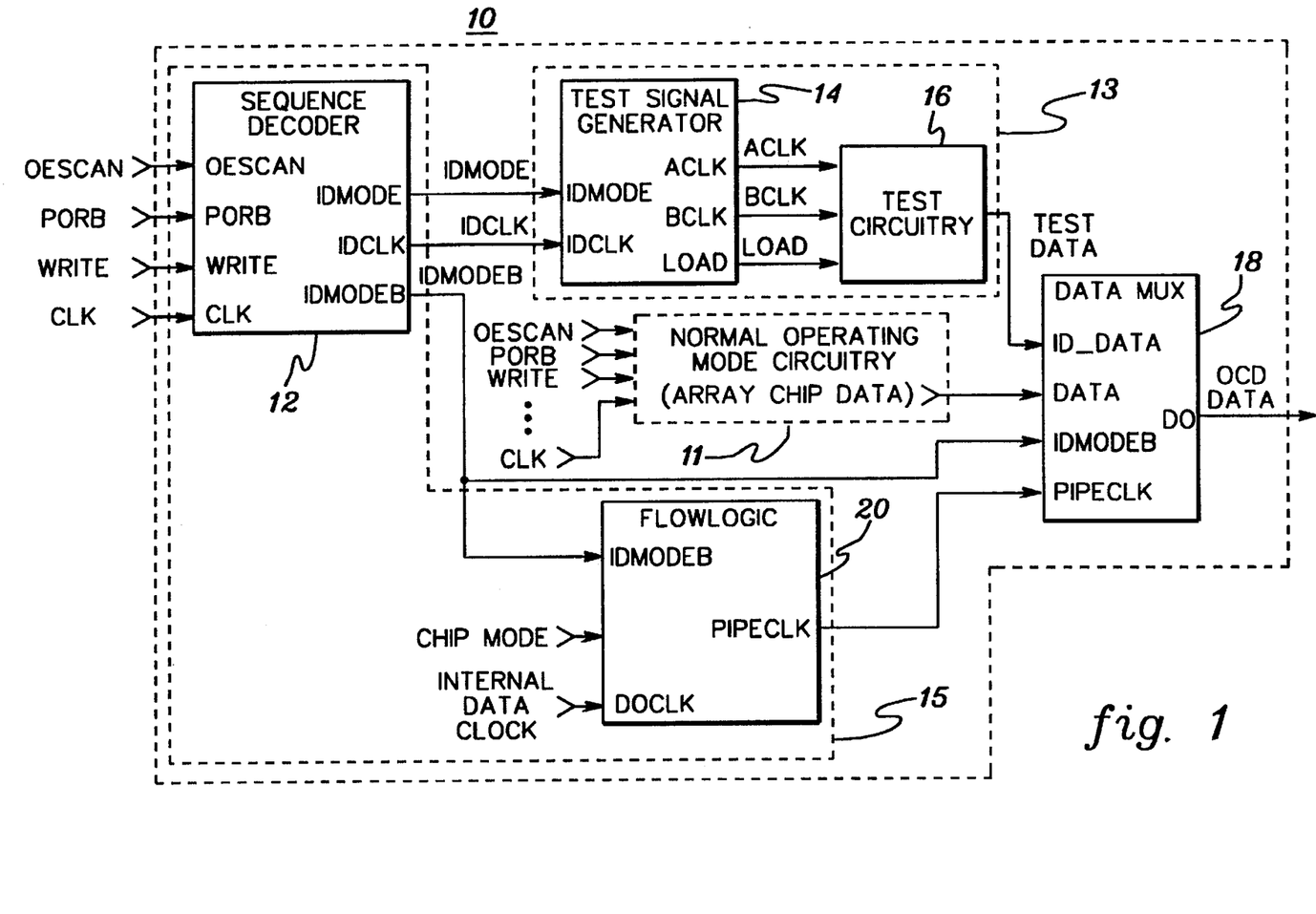
FIG. 1 is a block diagram representation one embodiment of integrated circuitry having circuit means for activating/deactivating a special non-functional mode at power-on in accordance with the present invention.

With the above discussion as an overview, refer now to the drawings wherein the same reference numbers are used throughout multiple figures to designate the same or similar components. FIG. 1 depicts one embodiment of an integrated circuit, generally denoted 10, in accordance with the present invention for controlling a die's self-identification/test mode. Circuit 10, comprising an integrated circuit device or chip such as a RAM, includes a sequence decoder 12, a test signal generator 14, test circuitry 16, a data MUX 18 and data flow control logic 20. Described at a higher level, circuit 10 comprises normal operating mode circuitry 11, special operating mode circuitry 13 and an activation/deactivation circuit 15. As shown in FIG. 1, sequence decoder 12 and flow control logic 20 comprise part of activation/deactivation circuit 15, while test signal generator 14 and test circuitry 16 comprise special operating mode circuitry 13. As used herein, the phrase "test circuitry" includes identification circuitry as well as any embedded diagnostic or boundary scan circuitry. Operationally, sequence decoder 12 receives four circuit input signals, namely, a buffered output enable signal (OESCAN), an active low power-on reset signal (PORB) (wherein "B" denotes an inverted signal), an active high pulse write signal (WRITE), occurring when the device is clocked in a write state, and an internally generated active high clock pulse (CLK). Output from sequence decoder 12 are identification mode signals (IDMODE, IDMODEB) and an identification clock (IDCLK) which pulses once per cycle, and is generated from the CLK signal.

Figure 2:
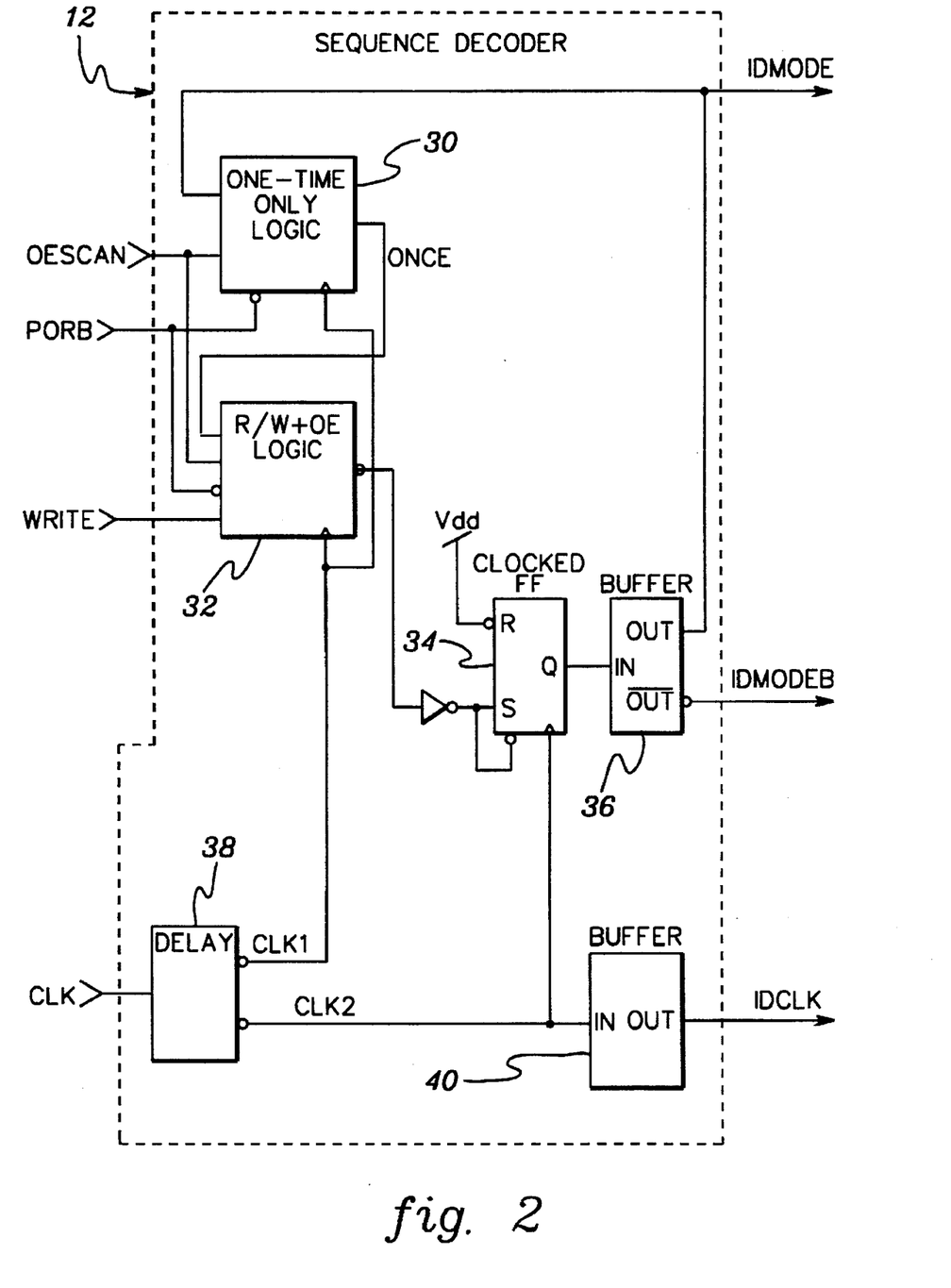
FIG. 2 is a schematic of one embodiment of a sequence decoder for the circuit of FIG. 1.
Figure 3:
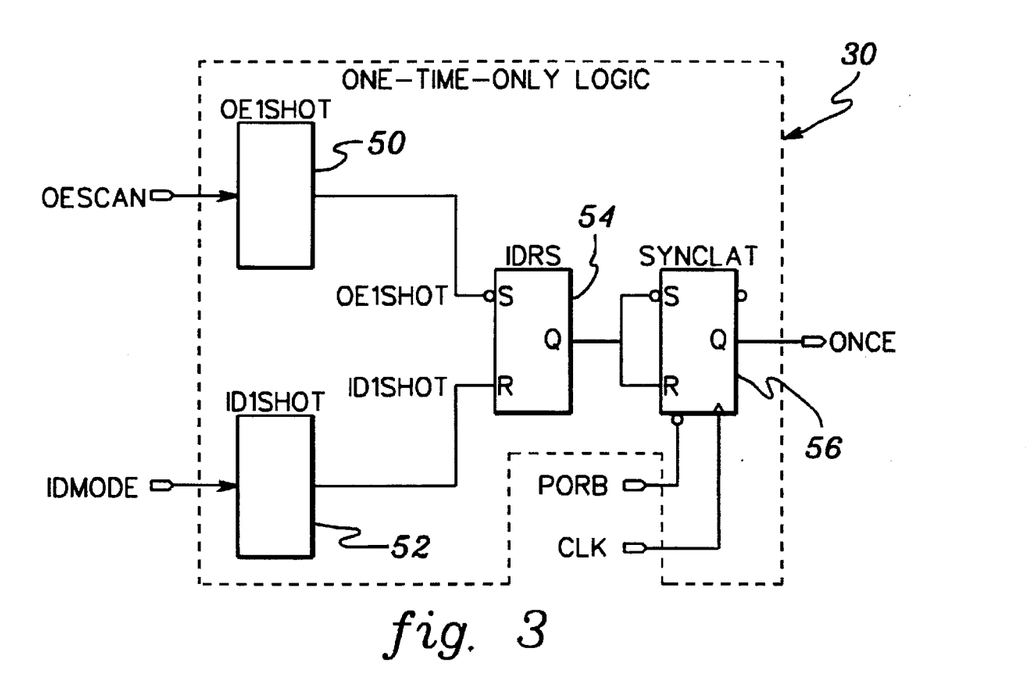
FIG. 3 is a schematic of one embodiment of one-time-only logic for the sequence decoder of FIG. 2.

One embodiment of sequence decoder 12, depicted in FIG. 2, includes a one-time-only logic circuit 30 and a read/write (R/W) and output enable (OE) logic circuit 32. As explained below, logic 30 determines whether an identification mode is pending or invoked, while circuit 32 determines whether an identification mode is possible. An implementation of circuit 30 is shown in FIG. 3. This one-time-only logic outputs a signal labeled ONCE which tracks whether the identification mode has been initiated during the present power-on cycle. The inputs are OESCAN, a feedback of IDMODE, PORB, and CLK1 (a delayed version of the received clock signal CLK), all described above. OE1SHOT 50 and ID1SHOT 52 provide a single pulse high-to-low transition signal of approximately a nanosecond width whenever the respective input signal, OESCAN and IDMODE, goes high. These single pulses are fed to the set (S) and reset (R) inputs, respectively, of a clocked RS flip-flop 54 (IDRS). Output from flip-flop 54 feeds a synchronous latch 56 (SYNCLAT) which is clocked by CLK and cleared by the PORB signal.

In operation, the synchronous latch is cleared at power on by PORB, which sets the ONCE signal to a logic zero. On a zero to one state change of IDMODE, an active high pulse is generated which resets RS flip-flop 54. At the next clock cycle, the ONCE signal will go low indicating that IDMODE has been decoded (i.e., special identification mode is now pending). Further attempts to decode IDMODE are then inhibited. On a zero to one state change of OESCAN, an active low pulse is generated which sets RS flip-flop 54. At the next clock cycle, the ONCE signal output will go high, indicating that the identification mode has been selected and is ready to be decoded. This action allows for a specific entry point into the identification/test mode (for example, the X+1 cycle following a die output enabled-to-disabled-to-enabled transition as discussed above).

Figure 4:
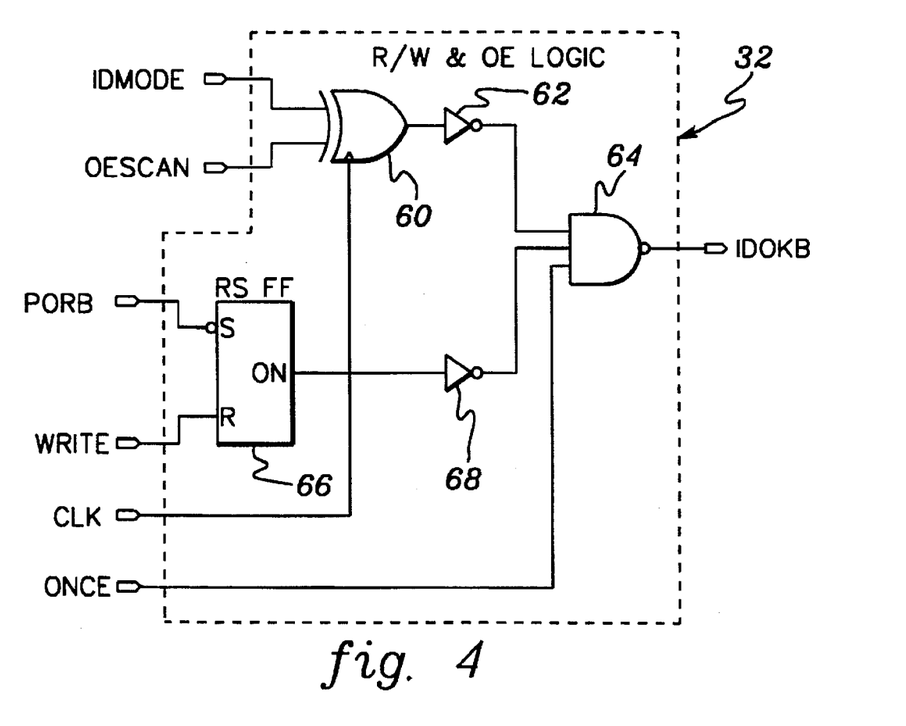
FIG. 4 is a schematic of one embodiment of a read/write (R/W) and output enable (OE) logic circuit for the sequence decoder of FIG. 2.

The read/write (R/W) and output enable (OE) logic 32 comprises fail-safe logic which determines whether or not a selected identification mode is possible. An embodiment of this logic 32 is depicted in FIG. 4. The resulting signal is identification mode okay bar (IDOKB). The circuit receives as inputs the IDMODE, OESCAN, PORB, WRITE, CLK and ONCE signals, all previously described. Briefly, IDMODE is high when the circuit is in special operating mode, or when special operating mode is pending. OESCAN comprises an inverted version of the output enable pin, PORB is an active low pulse generated at power up by CLR (a conventional signal on a RAM device); WRITE is active high when the device is clocked in a write state, CLK is an internally generated active high clock pulse, and ONCE is the output signal of the circuit of FIG. 3.

A two input, clocked exclusive NOR circuit 60 receives at a first node the IDMODE signal, and at a second node the OESCAN signal. The output of logic 60 is passed through an inverter 62 to a three input NAND gate 64, which outputs the IDOKB signal. The power-on reset bar (PORB) signal is fed to the set (S) input of an RS flip-flop 66, which receives at its reset (R) terminal the WRITE signal. Output from flip-flop 66 is passed through an inverter 68 to another input of the three input NAND gate 64. The final input to NAND gate 64 comprises the ONCE signal from one-time-only logic 30 of FIG. 3. Note that IDOKB is the main control signal. When IDOKB is high, counts are inhibited and each flip-flop 34 (FIG. 2) is asynchronously cleared. When IDOKB is low, however, the clear is released and the output of each flip-flop 34 is allowed to feed the next flip-flop (with only one flip-flop being shown in FIG. 2).

At die power up, the state of RS flip-flop 66 is set by PORB. This presents a logic one to the respective input to NAND gate 64. Since the identification mode has not yet been enabled, the IDMODE signal is low. If OESCAN is low (i.e., die outputs are disabled), the input to NAND gate 64 from the XNOR gate is a logic one, and the ONCE signal is a logic one if the identification mode has not yet been invoked. The result is that IDOKB is a logic zero, allowing the decode for the identification mode. If WRITE is pulsed, i.e., the die is clocked in a write state, then RS flip-flop 66 is reset, and identification mode signal IDOKB is cancelled. From this point, latch 66 can only be set by recycling power on to the die. Also, if by the clock cycle after which the identification mode is enabled (the X+1 cycle in the example above) OESCAN is not sampled high (i.e., die outputs enabled), then IDOKB is forced to a logic one, and the IDMODE is cancelled. The ONCE signal will also change state as a result, thereby not allowing re-entry into IDMODE until an OESCAN state change takes place. If ONCE is a logic zero, then IDOKB will be a logic one. If PORB is not generated for some reason, then the identification mode is simply not selected. This would happen, for example, if latch 66 powered up in a reset state, since there would be no PORB pulse to the latch. Again, PORB is known to be generated for a closed set of conditions which are assumed to be readily created with a die under test.

Returning to FIG. 2, output from R/W & OE logic 32, i.e., IDOKB, is employed by a sequence of 'X' clocked flip-flops, wherein $X \geq 1$, with only one flip-flop 34 being shown in the figure. Flip-flop 34 determines when X consecutive clock signals have occurred with OESCAN low (again, in this example, OESCAN must have been high prior to the X cycles). Once identified, the IDMODE signal switches high. Sometime before the X+1 cycle, OESCAN must switch to a logic one for IDMODE to remain high. If this does not happen, the ONCE signal will go low and keep flip-flop(s) 34 from counting. This will cause a LOAD signal to occur (FIG. 1), but no ACLK or BCLK will be generated, since IDMODE goes low before the next CLK reaches the test signal generator circuit 14 (FIG. 1). ID mode will be disabled until a state change occurs on OESCAN. When a new high-to-low transition of OESCAN is encountered, the watch for X consecutive cycles is again started. For proper timing, sequence decoder 12 also includes a buffer 36 which receives the output of flip-flop 34, and a delay circuit 38 which receives the CLK signal and outputs therefrom a first delayed clock CLK1 and a second delayed CLK2 employed as shown. Clock CLK2 is passed through a buffer 40 and output from decoder 12 as the IDCLK signal.

Returning to FIG. 1, and as noted, outputs IDMODE and IDCLK drive test signal generator circuit 14, which generates the LOAD signal. LOAD comprises a pulse signal which is generated the first time the identification mode is entered. If test circuitry 16 is assumed to comprise a programmed identification array, such as a fuse array, then the LOAD signal results in a parallel loading of a shift register (within test circuitry 16) with the identification data. This register is then clocked by ACLK and BCLK signals derived from IDCLK and output from test generator 14. With every ACLK and BCLK, identification data is shifted through the shift register and output as test data (or identification data) to data MUX 18, which as described below, passes the data through one or more output terminals as off-chip driver (OCD) data.

Figure 5:
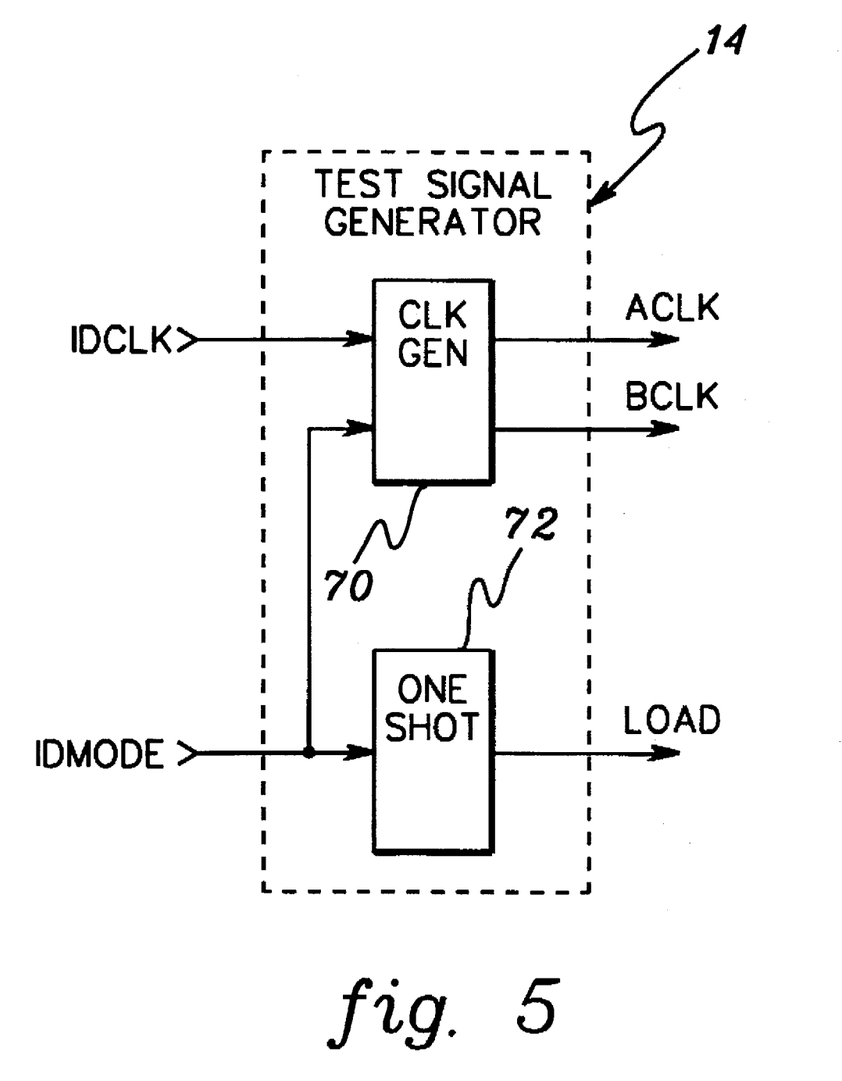
FIG. 5 is a schematic of one embodiment of a test signal generator for the circuit of FIG. 1.

The particular implementation of test signal generator 14 will vary with the special operating mode circuitry to be driven. For example, circuitry 16 may comprise conventional embedded test circuitry or preprogrammed, die identification circuitry. In the identification mode example, test circuitry 16 is assumed to comprise non-volatile memory such as a fuse array with identification data that is parallel loaded to a shift register upon receipt of the LOAD signal. Clocks ACLK and BCLK then shift this identification data through the shift register (or scan chain). One embodiment of generator 14 to accomplish this result is depicted in FIG. 5. The IDMODE signal from decoder 12 is fed to a one shot pulse generator 72 which provides the LOAD signal output while a clock generation circuit 70 receives both the IDMODE and the IDCLK signal from decoder 12 to generate the A and B clock signals ACLK and BCLK.

Figure 6:
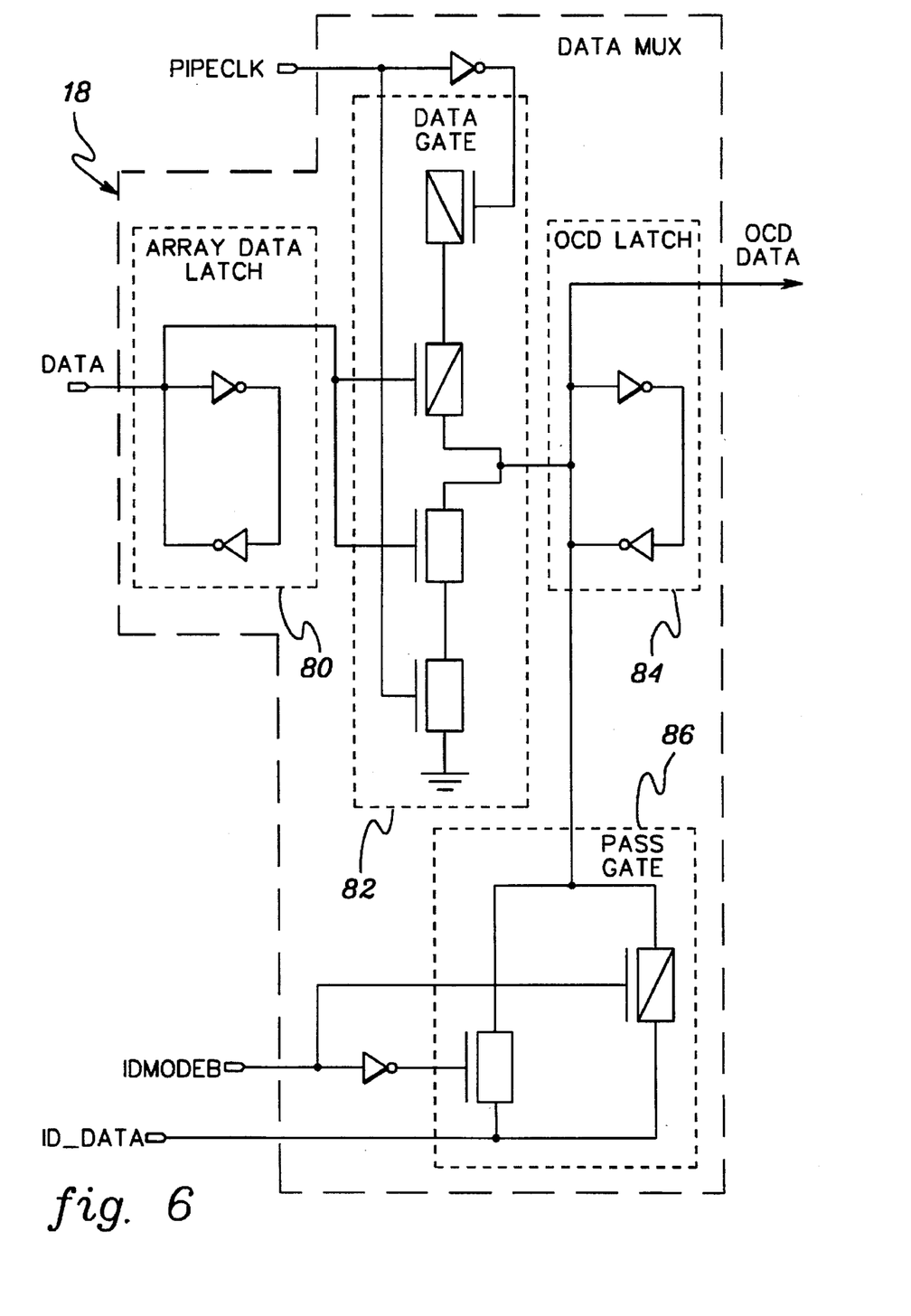
FIG. 6 is a schematic of one embodiment of a data MUX in accordance with the present invention for the circuit of FIG. 1.

Continuing with FIG. 1, test data (or identification data) is fed through data MUX 18 to be output on one or more data pins DQ as OCD data. Data MUX 18 receives as input the identification data ID_DATA from special mode circuit 13, the standard memory array chip data (DATA), i.e., from normal operating mode circuit 11, the IDMODEB signal, and a control clock signal, labeled PIPECLK both from the activation/deactivation circuitry 15. Signal PIPECLK controls a data gate within data MUX 18, one embodiment of which is depicted in FIG. 6. As shown, the MUX includes an array data latch 80, a data gate 82, an OCD latch 84 and a pass gate 86. Circuitry 80, 82 and 84 comprise conventional circuits typically connected as shown as a data MUX for output of data during the normal operating mode of a RAM device. The transistors of data gate 82 comprise complementary metal-oxide semiconductor (CMOS) circuits with P-channel field-effect transistors (PFETs) indicated by a rectangle with a diagonal line formed therein and a control element or gate electrode arranged adjacent thereto, and N-channel field-effect transistors (NFETs) indicated by a rectangle without a diagonal line but with a control element or gate electrode arranged adjacent thereto.

Referencing FIG. 1, signal PIPECLK is assumed to originate with flowlogic 20. In this example, the RAM die (i.e., integrated circuit 10) is also assumed to comprise a dual mode RAM having both flow through and pipeline modes. The pipe clock signal (PIPECLK) is therefore employed to select a particular mode of operation. Flowlogic 20 responds to the IDMODEB signal, a chip mode select signal (CHIP MODE) and an internal data clock (DOCLK). The PIPECLK output from flowlogic 20 can be expressed as follows.

| CHIP MODE | PIPECLK |
|---|---|
| FLUSH | DC HIGH |
| PIPE | PULSED HIGH |
| ID | DC LOW |

When in flush mode, data gate 82 (FIG. 6) between latch 80 and latch 84 is always open, while in the pipeline mode, the data gate is clocked. In accordance with the invention, flowlogic 20 (FIG. 1) which makes this data control determination, is itself controlled by the identification mode signal IDMODEB. When IDMODEB is a logic zero (ID mode enabled), the data gate is closed and data is steered into OCD latch 84 (FIG. 6) from the identification data shift register of test circuitry 16 (FIG. 1) via pass gate 86. Again, in this example data is chosen to be output serially through one data output, but could be driven to any number or all of the die's multiple OCDs in parallel, or with multiple serially output data. All unused OCDs have static data in their latches. Note that this modified data MUX in accordance with the invention does not result in any additional loading of the critical output data path.

Those skilled in the art will note from the above discussion that a novel approach to initiating and disabling a special non-functional mode subseuquent to power-on is provided herein which is totally transparent to proper operation of a die's functional mode circuitry. The approach allows a manufacturer the ability to electronically read identification data encoded onto a die without the possibility of such a special identification mode interfering with subsequent normal product operation. Identification data can include production run number, lot number, die location on wafer, manufacturing codes, etc. Thus, real time feedback can be provided on both reliability and die defects. Die tracking, sorting verification, etc. are obvious benefits to such electronic die marking and reading.

In addition, embedded test circuitry may be provided for an integrated circuit die having no standardly defined test mode (e.g., as defined by JTAG convention) or dedicated test pin. Any desired test circuitry can be embedded, with the initiating/disabling approach presented herein making the test circuitry totally transparent to the resultant functioning of the integrated circuit. Thus, opportunity is provided for an embedded test mode on integrated circuits previously closed to such testing techniques. Any number of post power-on test or verification modes can be enabled/disabled employing a strategy in accordance with the present invention.

The concepts are particularly significant when employed in random access memory devices, wherein in accordance with the invention a first write cycle subsequent to power on is employed to cancel of a special non-functional mode, i.e., until power is recycled. The special operational mode is never available during normal chip operation and cannot be accidentally enabled subsequent to a first write cycle. For other devices, a different function than a write cycle could be employed to disable a special non-functional mode entered subsequent to power-on. Specifically, any function that must be carried out prior to or simultaneous with valid operation of an integrated circuit device is a candidate for this technique. A write cycle is convenient for a RAM device as termination point since no valid data is obviously available to be read until a write has been carried out sometime subsequent to power on of the device. As a further advantage, implementation of the concepts presented adds no delay to the critical path for devices that already incorporate a gated final latch, i.e., a off-chip driver latch.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. An integrated circuit having a normal operating mode and a special operating mode, comprising:

normal operating mode circuitry;

special operating mode circuitry;

activation circuitry electrically coupled to said special operating mode circuitry, said activation circuitry including first circuit means responsive to powering-on of said integrated circuit, second circuit means responsive to clocking of an input signal to said normal operating mode circuitry in a predefined pattern of a first logic state and a second logic state, and third circuit means electrically coupled to said first circuit means and said second circuit means, said third circuit means being responsive to response of said first circuit means combined with response of said second circuit means for activating said special operating mode circuitry, thereby initiating said special operating mode.

2. The integrated circuit of claim 1, wherein said input signal to said normal operating mode circuitry comprises a first input signal to said normal operating mode circuitry and said first circuit means of said activation circuitry further comprises means responsive to clocking of a second input signal to said normal operating mode circuitry for deactivating said special operating mode circuitry in response to a predefined state of said second input signal, said deactivating of said special operating mode circuitry being transparent to functioning of said normal operating mode circuitry in response to said second input signal.

3. The integrated circuit of claim 2, wherein said integrated circuit comprises a random access memory, said second input signal comprises a write signal to said random access memory, and said predefined state comprises a write enable state.

4. The integrated circuit of claim 2, wherein said first input signal comprises an output enable signal to said normal operating mode circuitry.

5. The integrated circuit of claim 2, further comprising an output node electrically coupled to said normal operating mode circuitry and to said special operating mode circuitry, and wherein said special operating mode circuitry comprises identification circuitry containing identification data for said integrated circuit and shift register means coupled between said identification circuitry and said output node for shifting of said identification data to said output node during said special operating mode.

6. The integrated circuit of claim 5, wherein said identification circuitry comprises a preprogrammed fuse array containing said identification data.

7. The integrated circuit of claim 2, wherein said special operating mode circuitry comprises test circuitry for testing said normal operating mode circuitry.

8. The integrated circuit of claim 2, wherein said second input signal comprises an input signal to said normal operating mode circuitry required to precede a valid data output from said integrated circuit during said normal operating mode.

9. The integrated circuit of claim 2, wherein said means for deactivating said special operating mode circuitry includes logic circuitry for preventing reactivating of said special operating mode circuitry while power to said integrated circuit is maintained.

10. The integrated circuit of claim 1, wherein said second circuit means comprises logic means for recognizing the predefined pattern, said predefined pattern comprising said first logic state occurring in X successive clock cycles of the integrated circuit, wherein $X \geq 1$, followed by said second logic state occurring in Y successive clock cycles of the integrated circuit, wherein $Y \geq 1$, followed by said first logic state occurring in the next subsequent clock cycle of the integrated circuit.

11. A deactivation circuit for deactivating special operating mode circuitry of an integrated circuit transparent to functioning of normal operating mode circuitry of the integrated circuit, said deactivation circuit comprising a logic circuit responsive to clocking of an industry standard input signal to the normal operating mode circuitry, said industry standard input signal comprising a signal required to precede outputting of valid data from said normal operating mode circuitry, the logic circuit comprising means for deactivating the special operating mode circuitry in response to a predefined state of the industry standard input signal, said deactivating of the special operating mode circuitry being transparent to functioning of said normal operating mode circuitry in response to said industry standard input signal.

12. The deactivation circuit of claim 11, wherein said integrated circuit comprises a random access memory device, said industry standard input signal comprises a write signal to said random access memory device, and said predefined state comprises a write enable state.

13. In an integrated circuit having a normal operating mode, a method for activating/deactivating a special operating mode, said method comprising:

(a) powering on said integrated circuit;

(b) subsequent to said step (a), monitoring a first, normal operating mode input signal for a predetermined pattern of a first normal logic state and a second normal logic state clocked in successive clock cycles; and (c) responding to monitoring of said predetermined pattern in said step (b) by activating said special operating mode.

14. The method of claim 13, further comprising deactivating said special operating mode in response to receipt of a second, normal operating mode input signal having a predefined logic state, said deactivating of said special operating mode being transparent to functioning of said normal operating mode in response to said second, normal operating mode input signal, said second, normal operating mode input signal comprising a signal required to precede outputting of valid data from the integrated circuit during said normal operating mode.

15. The method of claim 14, further comprising subsequent to said deactivating, maintaining deactivation of said special operating mode while power is maintained to said integrated circuit.

16. The method of claim 14, wherein said integrated circuit comprises a random access memory (RAM) device, said first, normal operating mode input signal comprises an output enable signal to said RAM device, and said second, normal operating mode input signal comprises a write signal to said RAM device, wherein said predefined state of said second, normal operating mode input signal comprises a write enable state.

17. The method of claim 13, further comprising outputting special operating mode data from said integrated circuit, said special operating mode data comprising at least one of identification data for said integrated circuit and test data derived from testing of said integrated circuit during said special operating mode.

18. A method for controlling operation of an integrated circuit having a normal operating mode and a special operating mode, said method comprising:

(a) initiating said special operating mode upon sensing powering on of said integrated circuit combined with detection of a predefined pattern of a first normal logic state and a second normal logic state clocked in successive clock cycles of a first industry standard input signal to said integrated circuit required for said normal operating mode;

(b) upon entering said special operating mode, performing a special non-functional process comprising at least one of reading prestored identification data from said integrated circuit and testing said integrated circuit via test circuitry embedded within said integrated circuit; and (c) deactivating said special operating mode upon receipt by said integrated circuit of a second industry standard input signal of a predefined logic state for said normal operating mode, said deactivating of said special operating mode being transparent to functioning of said normal operating mode in response to said second industry standard input signal, said second industry standard input signal comprising a signal required to precede outputting of valid data from the integrated circuit during said normal operating mode.

19. The method of claim 18, wherein said integrated circuit comprises a random access memory (RAM) device, and said second industry standard input signal comprises a write signal for said RAM device, and said predefined logic state comprising a write enable state.

* * * * *